United States Patent
Palaniswamy et al.

(10) Patent No.: US 12,412,807 B2
(45) Date of Patent: Sep. 9, 2025

(54) PATTERNED DESIGN FOR THERMAL MANAGEMENT OF TWO-PHASE IMMERSION COOLING SYSTEM FOR ELECTRONICS

(71) Applicant: 3M INNOVATIVE PROPERTIES COMPANY, St. Paul, MN (US)

(72) Inventors: Ravi Palaniswamy, Singapore (SG); Sung W. Moon, Woodbury, MN (US); Brinda B. Badri, Woodbury, MN (US); Siang Sin Foo, Serangoon (SG)

(73) Assignee: 3M Innovative Properties Company, St. Paul, MN (US)

( * ) Notice: Subject to any disclaimer, the term of this patent is extended or adjusted under 35 U.S.C. 154(b) by 523 days.

(21) Appl. No.: 17/781,129

(22) PCT Filed: Dec. 1, 2020

(86) PCT No.: PCT/IB2020/061326
§ 371 (c)(1),
(2) Date: May 31, 2022

(87) PCT Pub. No.: WO2021/111296
PCT Pub. Date: Jun. 10, 2021

(65) Prior Publication Data
US 2022/0415752 A1    Dec. 29, 2022

Related U.S. Application Data (60) Provisional application No. 62/944,422, filed on Dec. 6, 2019.

(51) Int. Cl.
*H01L 23/50*    (2006.01)
*H01L 23/427*   (2006.01)
*H05K 1/02*     (2006.01)

(52) U.S. Cl.
CPC .......... *H01L 23/427* (2013.01); *H05K 1/0209* (2013.01); *H05K 2201/064* (2013.01); *H05K 2201/066* (2013.01)

(58) Field of Classification Search
CPC ... H01L 23/3736; H01L 23/50; H01L 23/367; H01L 23/427; H01L 23/44;
(Continued)

(56) References Cited

U.S. PATENT DOCUMENTS

| | | |
|---|---|---|
| 4,359,086 A | 11/1982 | Sanborn et al. |
| 4,846,267 A | 7/1989 | Shattes et al. |

(Continued)

FOREIGN PATENT DOCUMENTS

| | | |
|---|---|---|
| CN | 103822519 B | 12/2015 |
| CN | 109974512 A | 7/2019 |

(Continued)

OTHER PUBLICATIONS

El-Genk, "Enhanced nucleate boiling on copper micro-porous surfaces", International Journal of Multiphase Flow, Oct. 2010, vol. 36 No. 2010, pp. 780-792.
(Continued)

*Primary Examiner* — Jay C Kim
*Assistant Examiner* — Joshua Scott Wyatt (57) ABSTRACT

A direct to chip cooling film for two-phase cooling. The film includes a dielectric layer having a first surface for attachment to a cold plate or circuits and having a second surface. A metal layer is on the second surface of the dielectric layer with a pattern of features on a side opposite the dielectric layer. This surface pattern provides increased surface area and multiple nucleation sites for bubbles formation for two-phase cooling. The features can also include metal nodules to further enhance the nucleation.

10 Claims, 6 Drawing Sheets

(58) Field of Classification Search
CPC . H01L 23/3731; H01L 23/3735; H01L 23/46; H05K 1/0209; H05K 2201/064; H05K 2201/066

See application file for complete search history.

(56) References Cited

U.S. PATENT DOCUMENTS

| | | | |
|---|---|---|---|
| 8,376,032 B2 * | 2/2013 | Song | H01L 23/427 165/80.4 |
| 11,881,248 B2 * | 1/2024 | Okutsu | G11C 11/4074 |
| 2009/0269521 A1 | 10/2009 | Tuma | |
| 2010/0110636 A1 | 5/2010 | Chou et al. | |
| 2011/0017431 A1 | 1/2011 | Yang et al. | |
| 2011/0157834 A1 | 6/2011 | Wang et al. | |
| 2017/0338167 A1 | 11/2017 | Bozorgi et al. | |
| 2018/0128553 A1 | 5/2018 | Lewis et al. | |
| 2018/0228051 A1 | 8/2018 | Chainer et al. | |
| 2018/0294206 A1 | 10/2018 | Chainer et al. | |

FOREIGN PATENT DOCUMENTS

| | | |
|---|---|---|
| EP | 2074874 B1 | 2/2010 |
| JP | S5265341 A | 5/1977 |
| JP | S5373654 A | 6/1978 |
| JP | 2008205453 A | 9/2008 |
| JP | 2015015322 A | 1/2015 |
| JP | 2018197631 A | 12/2018 |
| WO | 2002023115 A2 | 3/2002 |
| WO | 2007056571 A2 | 5/2007 |
| WO | 2010048058 A1 | 4/2010 |

OTHER PUBLICATIONS

International Search Report for PCT International Application No. PCT/IB2020/061326, mailed on Mar. 5, 2021, 3 pages.

* cited by examiner

PATTERNED DESIGN FOR THERMAL MANAGEMENT OF TWO-PHASE IMMERSION COOLING SYSTEM FOR ELECTRONICS

CROSS REFERENCE TO RELATED APPLICATIONS

This application is a national stage filing under 35 U.S.C. 371 of PCT/IB2020/061326, filed Dec. 1, 2020, which claims the benefit of U.S. Provisional Application No. 62/944,422 filed Dec. 6, 2019, the disclosures of which are incorporated by reference in their entireties herein.

BACKGROUND

High density semiconductor chips produce high temperature, requiring a thermal management solution to maintain the chip operating temperature intact. Immersion cooling technology is being considered for the new data centers as part of the thermal management solution. The immersion cooling technique involves a phase change in a thermal transport process whereby it reduces interfacial resistance when it is in contact with heated semi-conductor devices.

SUMMARY

A dielectric fluid such as fluorocarbon chemicals are being used for immersion two-phase cooling systems. However, due to its low surface tension and wetting nature, the fluid penetrates deep into cavities, which promotes build-up of superheat on the chip surface. This build-up results in local hot spots on the chip surface and results in thermal stress that eventually degrades the chip performance and increases the chip failure rate. Embodiments of this invention include films that can alleviate that build-up of local hot spots and enhance two-phase cooling of electronics.

A first film with features for two-phase cooling includes a dielectric layer having a first surface for attachment to a cold plate or circuits and having a second surface. A metal layer is on the second surface of the dielectric layer and has a pattern of features on a side opposite the dielectric layer.

A second film with features for two-phase cooling includes a metal layer having a first surface for attachment to a cold plate or circuits and having a second surface. Metal stands are on the first surface of the metal layer with a bonding material between the metal stands. A plurality of metal nodules are on the second surface of the metal layer.

DETAILED DESCRIPTION

Embodiments include flexible or rigid heat transfer nucleation films having features, such as patterns and nodules, to enhance two-phase immersion cooling systems for electronics. The films include a dielectric and a thin metal layer formed on top of the dielectric with uniform metal patterns formed on the thin metal layer. The uniform metal patterns include three-dimensional microstructures and are formed with a specific trace width and thickness. One or more cavities extend through the bottom side of the dielectric, and a solder or metallic paste is filled inside the dielectric cavities, which helps the films to attach with a thick cold plate to electronics for cooling or attach directly to the electronics without the thick cold plate.

Figure 1A:
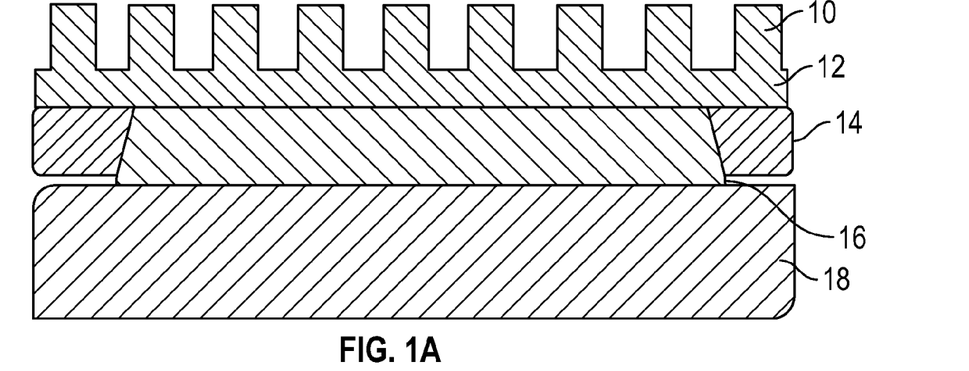
FIG. 1A is a side sectional view of a chip cooling film with a micro-pattern.
Figure 1B:
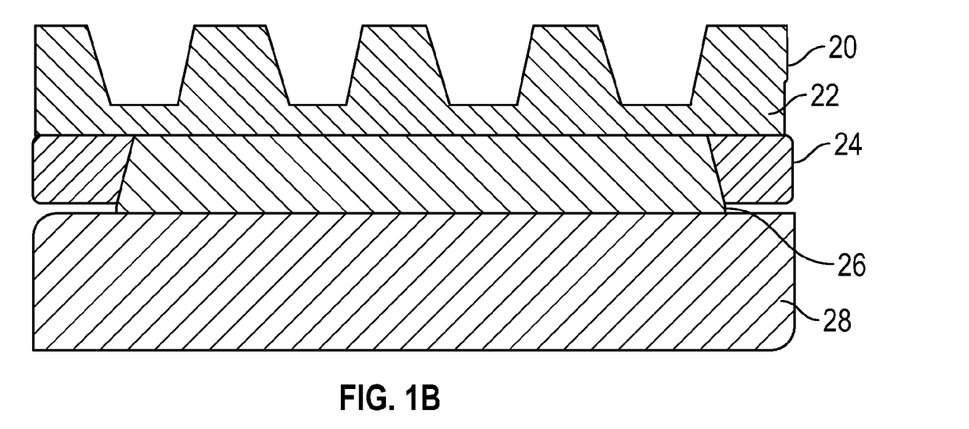
FIG. 1B is a side sectional view of a chip cooling film with a micro-pattern having angled sidewalls.

FIG. 1A is a side sectional view of a chip cooling film with a micro-pattern, attached to a cold plate 18, and having, arranged as shown, metal features 10, a thin metal layer 12, a dielectric 14, and solder 16. FIG. 1B is a side sectional view of a chip cooling film with a micro-pattern having angled sidewalls, attached to a cold plate 28, and having, arranged as shown, slanted metal micro features 20, a thin metal layer 22, a dielectric 24, and solder 26.

The microstructures of the metal features 10 and 20 can be formed either by an additive electroplating plating process using a photo mask or using subtractive process using a photo mask. Developing a micro-pattern creates more surface area and nucleating sites for the bubble formation during heating. Also, the uniformity of the metal microstructure is critical to provide uniform heat dissipation across the surface.

These micro-patterns help to nucleate the bubbles to transport the thermal load from electronics. The space and the features size of the micro-patterns are can be tailored depending on the required thermal performance.

Figure 2:
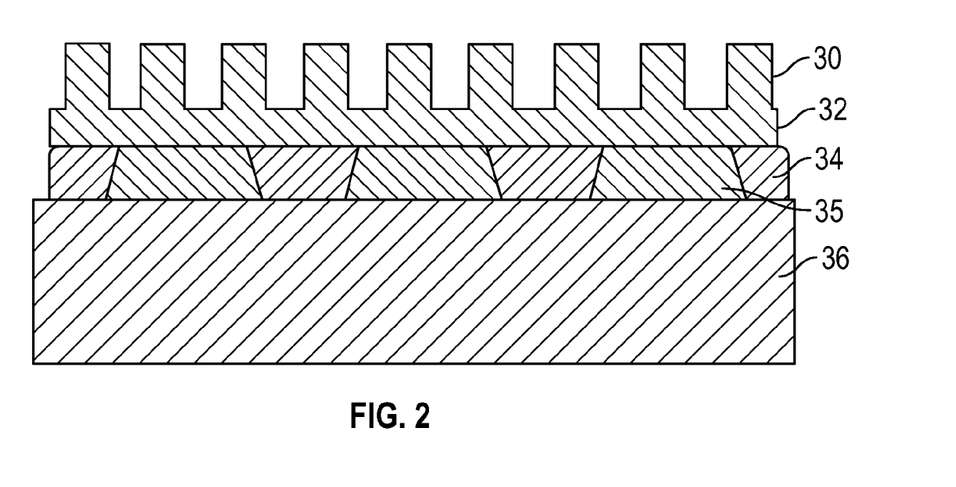
FIG. 2 is a side sectional view of a chip cooling film with a micro-pattern and multiple cavities.

Furthermore, the dielectric can be etched to create one or more cavities which are then filled with a solder 35, as shown in FIG. 2. FIG. 2 is a side sectional view of a chip cooling film with a micro-pattern and multiple cavities, attached to a cold plate 36, and having, arranged as shown, metal features 30, a thin metal layer 32, a dielectric 34, and cavities containing solder 35. The cavities can help to provide structural integrity of circuits attached to the cold plate when it is subjected to solder reflow. Microstructures of metal features 30 can be formed as described above.

Figure 3A:
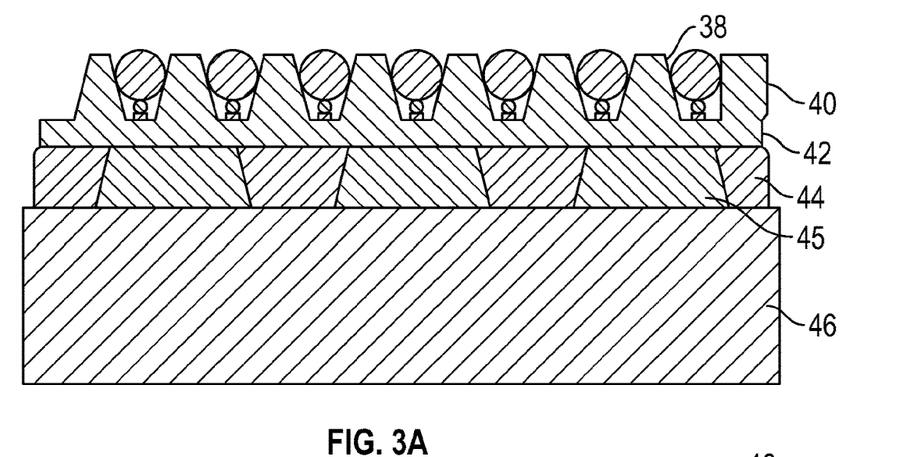
FIG. 3A is a side sectional view of a chip cooling film with a micro-pattern having angled sidewalls.
Figure 3B:
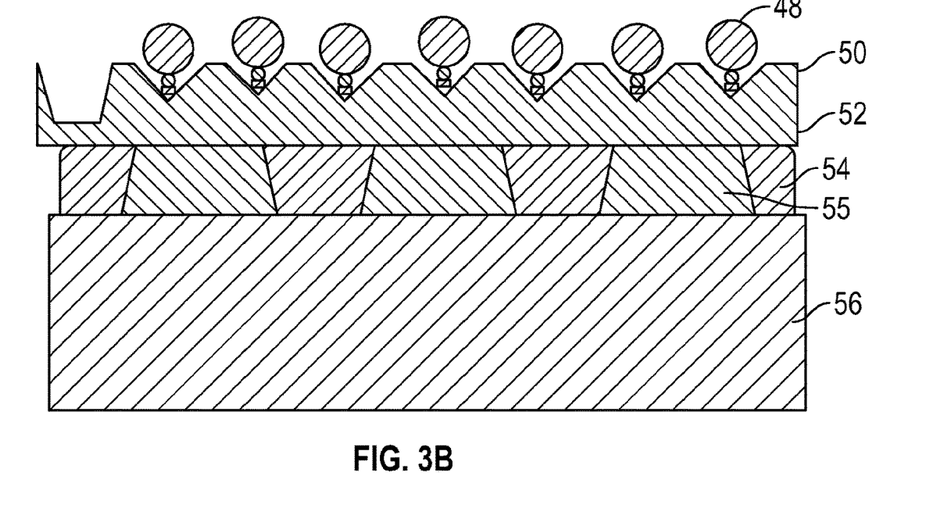
FIG. 3B is a side sectional view of a chip cooling film with a micro-pattern having angled sidewalls.

FIGS. 3A and 3B show metal features with different angles. FIG. 3A is a side sectional view of a chip cooling film with a micro-pattern having angled sidewalls, attached to a cold plate 46, and having, arranged as shown, angled sidewalls 38, metal features 40, a thin metal layer 42, a dielectric 44, and cavities containing a solder 45. FIG. 3B is a side sectional view of a chip cooling film with a micro-pattern having angled sidewalls, attached to a cold plate 56, and having, arranged as shown, a cone-type pattern 48, metal features 50, a thin metal layer 52, a dielectric 54, and cavities containing a solder 55. The slanted metal features produce more surface area and facilitate the flow of liquid in-between the metal features. Microstructures of metal features 40 and 50 can be formed as described above. Furthermore, the space is reduced on the bottom of the side wall to facilitate the rapid nucleation process. The gap and the side wall angle can be tailored according to the thermal performance requirement. FIG. 3B shows the uniform cone-type structure, which helps in nucleating at a faster rate and helps to form tiny bubbles due to narrow nucleating sites, accelerating the thermal dissipation performance.

Figure 4:
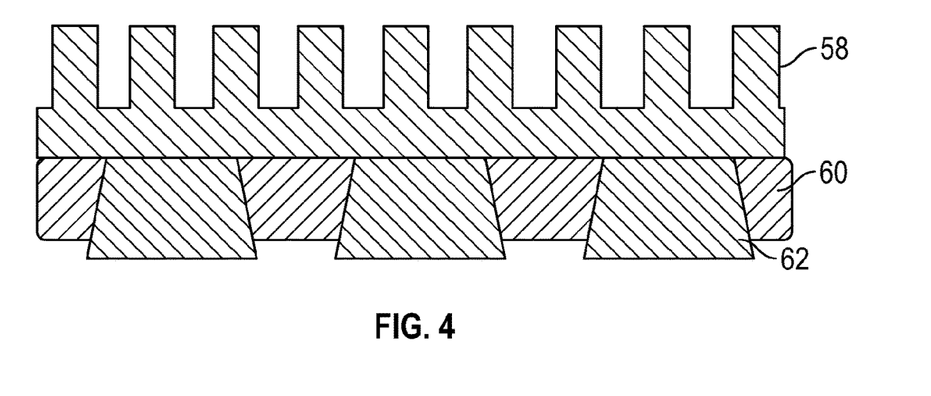
FIG. 4 is a side sectional view of a chip cooling film with a micro-pattern and an etched dielectric.

To provide structural integrity and enable easy handling of thin flexible chip cooling films, the dielectric can be further etched and filled with metal through via plating techniques, as shown in FIG. 4. FIG. 4 is a side sectional view of a chip cooling film with a micro-pattern and an etched dielectric and having, arranged as shown, micro features 58, a via 60 filled by metal, and solder or metallic paste 62. This filled etching provides the rigidity and enables easy handling during the solder reflow or other bonding process. The etching also enhances the thermal performance of the system.

Figure 5A:
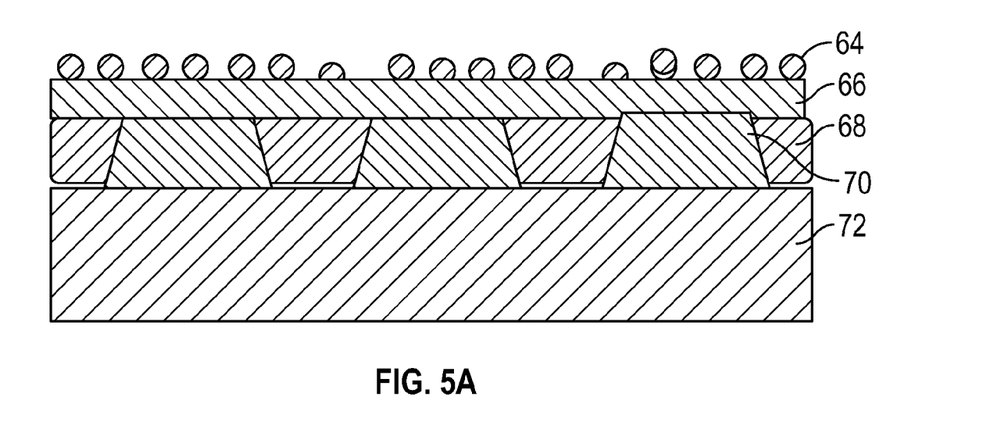
FIG. 5A is a side sectional view of a chip cooling film with nodules.

FIG. 5A shows the formation of the nodular features on the uniform metal layer. FIG. 5A is a side sectional view of a chip cooling film with nodules, attached to a cold plate 72, and having, arranged as shown, metal nodules 64, a thin metal layer 66, supporting metal stands 68, and vias 70. Uniform nodular features can be formed through an electroplating technique. Vias 70 extend between metal stands 68, and the vias can be formed by patterning followed by chemical etching of the dielectric layer. These vias can be filled with solder or metallic bonding paste either by screen print or dispensing which can then be attached to a thick rigid cold plate. These micro-patterns help to nucleate the bubbles to transport the thermal load from electronics. The nodule features size can be tailored depending on the required thermal performance.

Figure 5B:
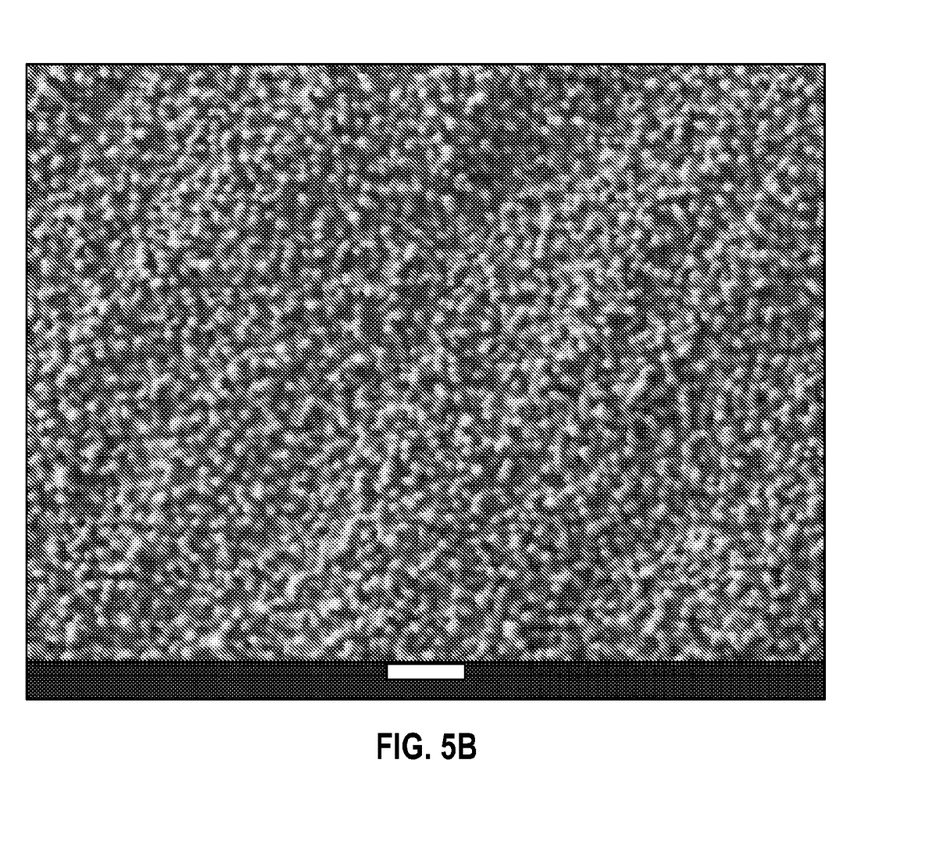
FIGS. 5B and 5C are top view images of the chip cooling film of FIG. 5A.
Figure 5C:
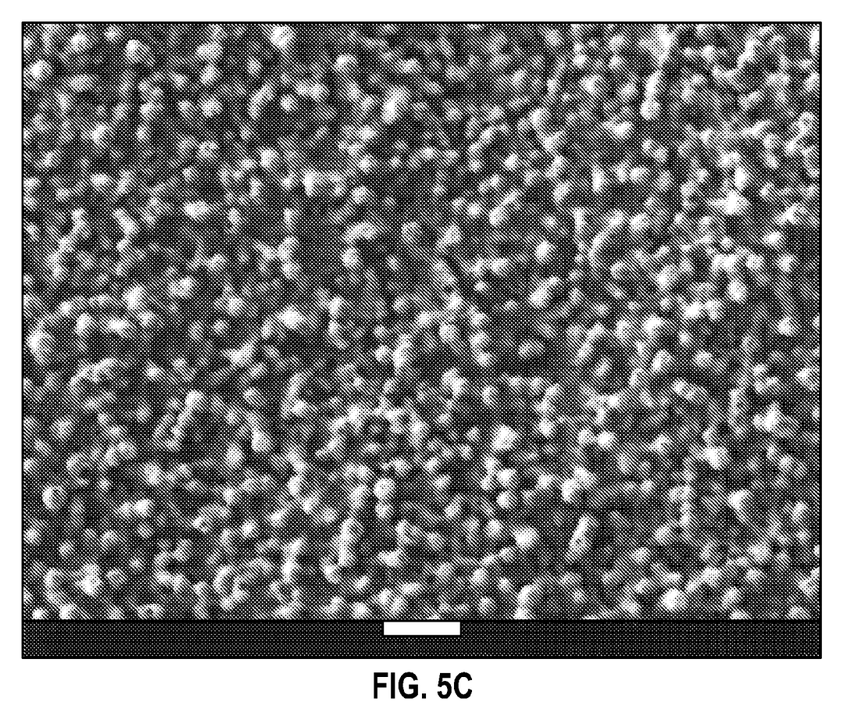

FIG. 5B shows the micrograph of the metal nodular grains and these nodules sizes, and the distance between the nodules can be tailored depending on the thermal performance requirements. FIG. 5C shows uniform roughness on the metal surface. Instead of nodules, uniform roughness can be created to enhance the thermal transport of the boiling system. The uniform nano- to micron-level roughness can help to develop a large amount of bubbles due the large surface area and nucleating sites.

Figure 6:
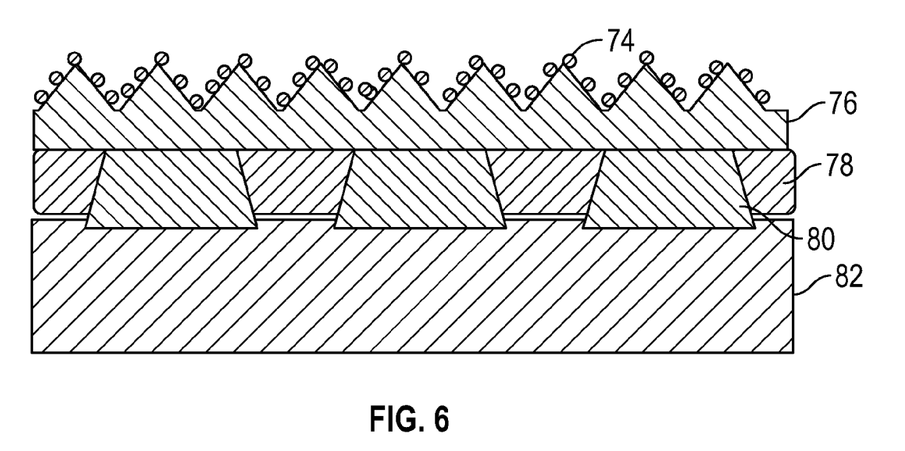
FIG. 6 is a side sectional view of a chip cooling film with nodules on an angled micro-pattern.

FIG. 6 shows nodules on a slanted uniform metal pattern. FIG. 6 is a side sectional view of a chip cooling film with nodules on an angled micro-pattern, attached to a cold plate 80, and having, arranged as shown, nodules 74, a thin metal layer 76, a dielectric 78, and vias 80 filled with a metallic bonding material. This surface pattern provides further increase in surface area and provides multiple nucleation sites for bubbles formation. Microstructures of metal layer 76 can be formed as described above.

Figure 7:
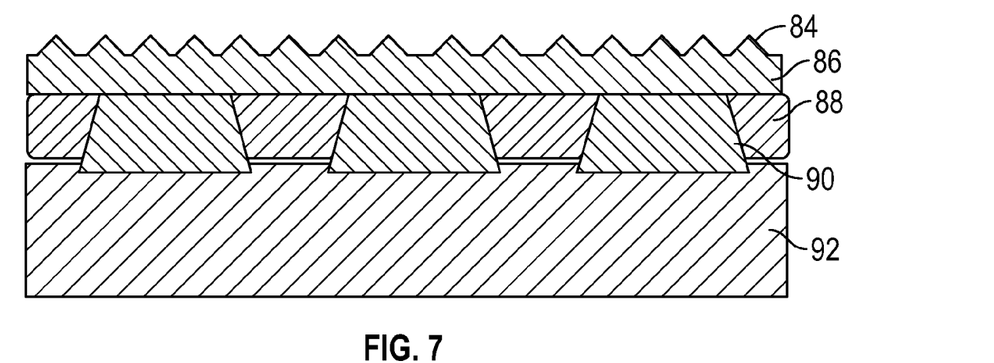
FIG. 7 is a side sectional view of a chip cooling film with a uniform pattern of microstructures.
Figure 8:
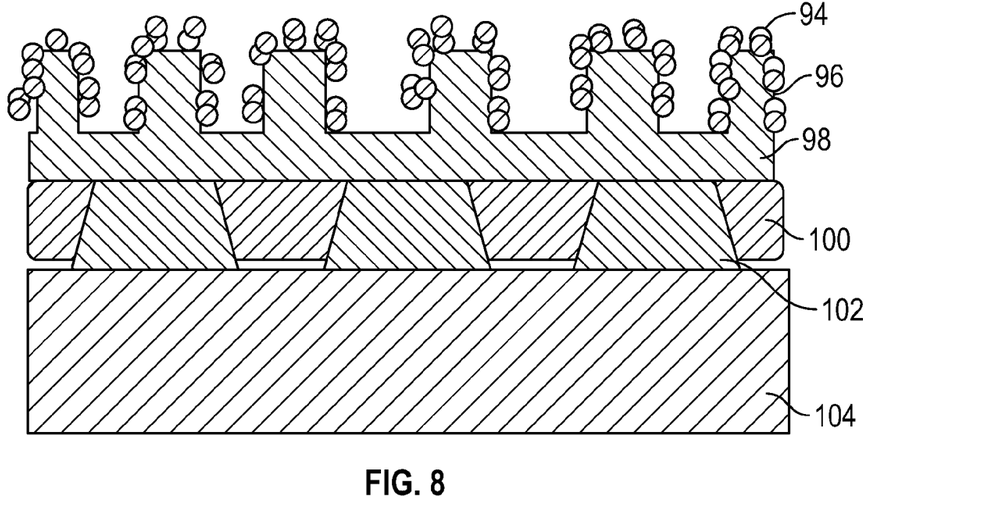
FIG. 8 is a side sectional view of a chip cooling film with a uniform pattern of features with nodules.

FIG. 8 shows another embodiment of nodule features on top of the uniform metal pattern shown in FIG. 7. FIG. 7 is a side sectional view of a chip cooling film with a uniform pattern of microstructures, attached to a cold plate 92, and having, arranged as shown, a uniform pattern of features 84, a thin metal layer 86, supporting metal stands 88, and vias 90 filled with a metallic bonding material. FIG. 8 is a side sectional view of a chip cooling film with a uniform pattern of features with nodules, attached to a cold plate 104, and having, arranged as shown, metal nodules 94, uniform metal features 96, a thin metal layer 98, supporting metal stands 100, and vias 102 filled with a metallic bonding material.

Multiple cavities can be formed under the single patterned cold plate, which helps to provide structural integrity of the circuits, as shown FIGS. 7 and 8, when it is subjected to solder reflow. The uniform metal microstructure features of the chip cooling films shown in FIGS. 7 and 8 can be formed either by an additive electroplating plating process using a photo mask or using subtractive process using a photo mask. Furthermore, the nodular plating can be carried out using an electroplating to form uniform nodules across the chip cooling film. Developing a micro-pattern and nodules on the patterned metal creates more surface area and nucleating sites for the bubble formation during heating. Uniformity of metal micro features is critical to provide uniform heat dissipation across the surface.

Figure 9:
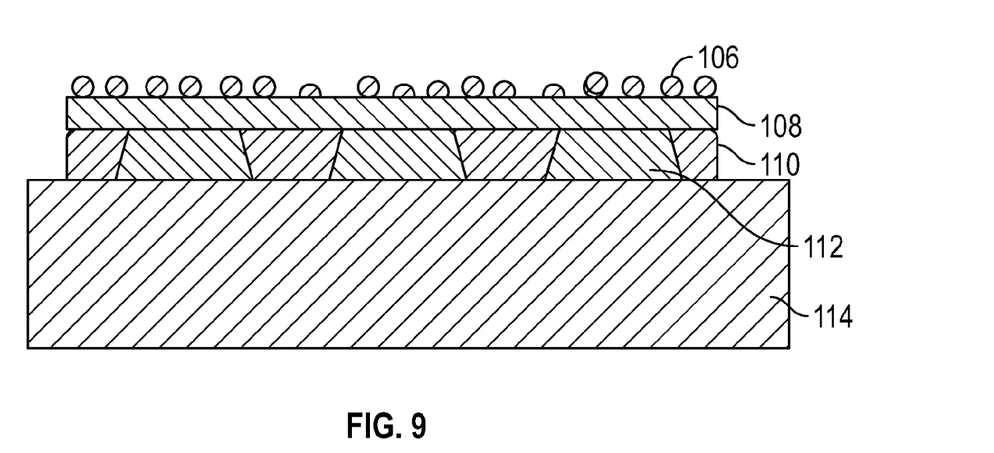
FIG. 9 is a side sectional view of a chip cooling film with nodules and multiple cavities.

FIG. 9 shows metal pillars under the thin metal features. These pillars can enhance the thermal performance due to more surface area and heat capacity, and the pillars can provide structural integrity when a circuit is attached with a thick metal cold plate. FIG. 9 is a side sectional view of a chip cooling film with nodules and multiple cavities, attached to a cold plate 114, and having, arranged as shown, metal nodules 106, a thin metal layer 108, supporting metal stands 110, and a solder or metallic bonding material 112. Once the metal nodules are formed as described above, the dielectric side of the film is patterned using a photomask and subjected to chemical etching of the dielectric to form cavities. After chemical etching process, the photoresist is removed. The etched portions are filled with metal using electroplating from inside the cavities to form metal pillars. Finally, the remaining exposed dielectric is removed by a chemical etching process to form cavities adjacent to the metal pillar. These cavities can be filled with metallic bonding materials to bond to the thick metal cold plate or directly to electronics.

The above features can also be formed using thick metal embossing techniques. A thick metal foil or plate can be embossed with different dimensions and features on the bottom followed by creation of uniform nodules using an electroplating technique. Finally, the embossed metal cavities are filled with the bonding material.

The following are exemplary materials, dimensions, and configurations for the chip cooling films described herein.

Suitable dielectric materials include polyimide, liquid crystalline polymer, PEEK polymer, polyethylene terephthalate, flexible FR4 sheets, and polyolefins. Suitable metal used for the creating features and layers are copper, steel, and silver. Suitable cover plating materials include gold, silver, and tin. Suitable bonding materials include solder, metal past, silver past, and anisotropic conductive film (ACF) bonding solution.

Suitable bonding materials include lead free solder, copper paste, silver paste, ACF film or paste, and thermal conductive adhesive.

A suitable thickness for the dielectric layer is within the range of 25 μm to 125 μm. A thickness for the via filled by metal can be within the range of 25 μm to 125 μm. The micro-patterned features can have a height of 5 μm to 100 μm from the underlying metal layer. The nodules can have diameters within the range of 0.1 μm to 5 μm.

The non-slanted metal features formed on the top metal surface have an angle of 90 degrees, within a particular tolerance, with respect to the underlying metal layer.

The slanted or angled metal features formed on the top metal surface can have an angle of about 30-90 degrees with respect to the underlying metal layer.

The etched dielectric cavities can have a slope angle of about 25-90 degrees with respect to the underlying cold plate or circuits. This trapezoidal slope angle helps in holding the metallic bonding paste, such as solder or silver, within the cavities.

Figure 10A:
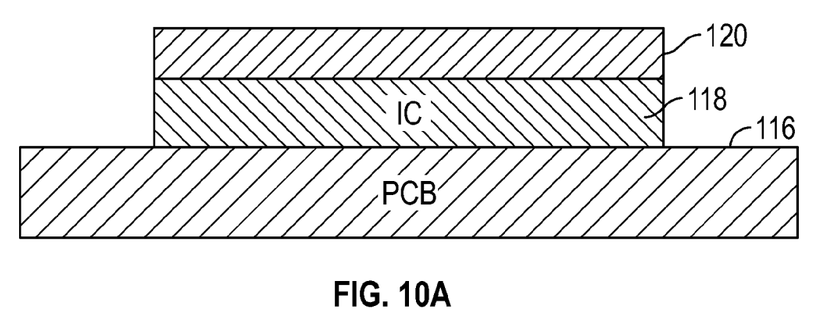
FIG. 10A is a diagram of a two-phase immersion cooling system.
Figure 10B:
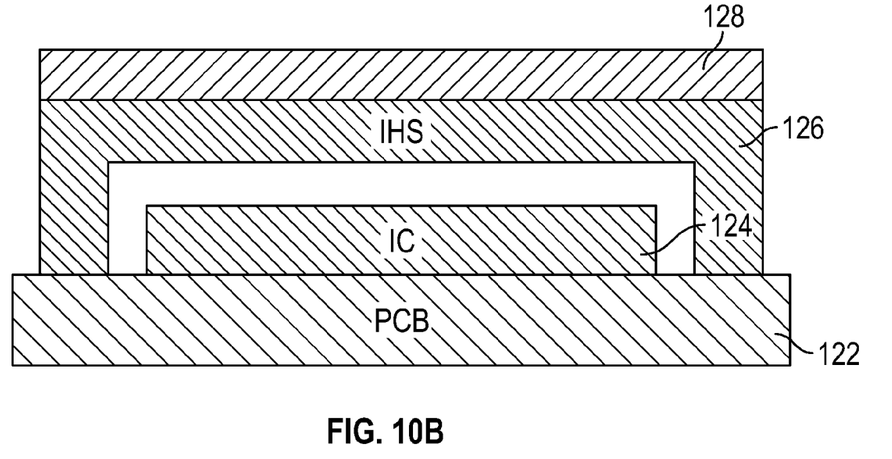
FIG. 10B is a diagram of a two-phase immersion cooling system using an internal heat spreader.
Figure 10C:
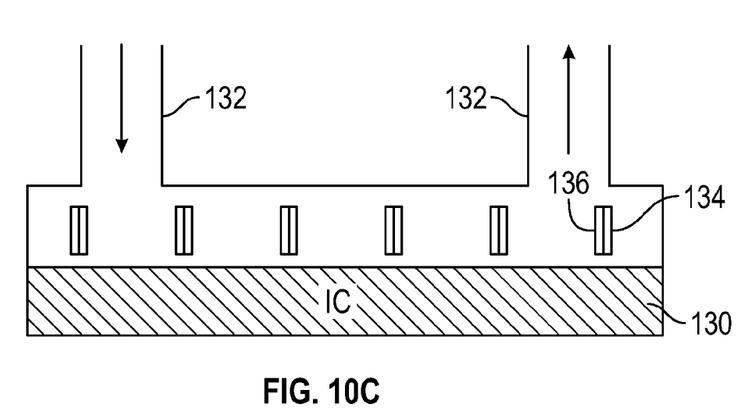
FIG. 10C is a diagram of a two-phase immersion cooling system using a pipe for a cooling fluid.

FIGS. 10A-10C are diagrams illustrating use of a chip cooling film in a two-phase cooling system.

FIG. 10A is a diagram of a two-phase immersion cooling system having a printed circuit board (PCB) 116, an integrated circuit (IC) 118, and a chip cooling film 120. The IC 118 can be attached to chip cooling film 120 using solder or a metal bonding material, such as the material within cavities or vias, without a separate thick metal cold plate.

FIG. 10B is a diagram of a two-phase immersion cooling system using an internal heat spreader and having a PCB 122, an IC 124, an internal heat spreader (IHS) 126, and a chip cooling film 128. Chip cooling film 128 can be attached to IHS 126 using solder or a metal bonding material, such as the material within cavities or vias, without a separate thick metal cold plate.

FIG. 10C is a diagram of a two-phase immersion cooling system using a pipe for a cooling fluid and having an IC 130, a pipe 132 for a cooling fluid, and internal baffles with chip cooling films such as a baffle 134 with a chip cooling film 136. Chip cooling film 136 can be attached to baffle 134 using solder or a metal bonding material, such as the material within cavities or vias, without a separate thick metal cold plate. Each of the baffles can include a chip cooling film attached in a similar manner.

Chip cooling films 120, 128, and 136 can be implemented with any of chip cooling films described herein and possibly with an associated metal cold plate. The chip cooling films can be used in a two-phase cooling system having flexible or rigid circuits. The chip cooling films can be attached in physical contact directly to the circuits without the use of a separate metal cold plate or, alternatively, used with a metal cold plate between and in physical contact with the circuits and chip cooling films.

The invention claimed is:

1. A two-phase cooling system for electronics, comprising:
  a printed circuit board;
  an integrated circuit on the printed circuit board; and
  a chip cooling film on the integrated circuit on a side opposite the printed circuit board, wherein the chip cooling film comprises:
    a dielectric layer having a first surface for attachment to the integrated circuit and having a second surface; and
    a metal layer on the second surface of the dielectric layer, the metal layer having a pattern of features on the metal layer on a side opposite the dielectric layer and for use in two-phase cooling when the film is attached to the integrated circuit,
    wherein the dielectric layer has a cavity having a trapezoidal inclination angle with respect to the integrated circuit, and
    wherein the film is attached to the integrated circuit by a metallic bonding material filled in the cavity.

2. The two-phase cooling system of claim 1, wherein the features have slanted sidewalls.

3. The two-phase cooling system of claim 1, wherein the features comprise a cone-type pattern.

4. The two-phase cooling system of claim 1, wherein the pattern is uniform.

5. The two-phase cooling system of claim 1, further comprising nodules on the features.

6. The two-phase cooling system of claim 5, wherein the nodules are composed of copper, steel, or silver.

7. The two-phase cooling system of claim 1, wherein the metal layer is composed of copper, steel, or silver.

8. The two-phase cooling system of claim 1, wherein the dielectric layer is composed of polyimide, liquid crystalline polymer, PEEK polymer, polyethylene terephthalate, flexible FR4 sheets, or polyolefins.

9. A two-phase cooling system for electronics, comprising:
  a printed circuit board;
  an integrated circuit on the printed circuit board;
  an internal heat spreader over the integrated circuit and on the printed circuit board; and
  a chip cooling film on the internal heat spreader on a side opposite the integrated circuit, wherein the chip cooling film comprises:
    a dielectric layer having a first surface for attachment to the internal heat spreader and having a second surface; and
    a metal layer on the second surface of the dielectric layer, the metal layer having a pattern of features on the metal layer on a side opposite the dielectric layer and for use in two-phase cooling when the film is attached to the heat spreader,
    wherein the dielectric layer has a cavity having a trapezoidal inclination angle with respect to the heat spreader, and
    wherein the film is attached to the heat spreader by a metallic bonding material filled in the cavity.

10. A two-phase cooling system for electronics, comprising:
  an integrated circuit;
  a pipe containing a cooling fluid in contact with the integrated circuit;
  baffles inside the pipe; and
  a chip cooling film on one or more of the baffles, wherein the chip cooling film comprises:
    a dielectric layer having a first surface for attachment to the one or more of the baffles and having a second surface; and
    a metal layer on the second surface of the dielectric layer, the metal layer having a pattern of features on the metal layer on a side opposite the dielectric layer and for use in two-phase cooling when the film is attached to the one or more of the baffles,
    wherein the dielectric layer has a cavity having a trapezoidal inclination angle with respect to the one or more of the baffles, and
    wherein the film is attached to the one or more of the baffles by a metallic bonding material filled in the cavity.

* * * * *